United States Patent
Tapily et al.

(10) Patent No.: US 10,217,670 B2
(45) Date of Patent: Feb. 26, 2019

(54) WRAP-AROUND CONTACT INTEGRATION SCHEME

(71) Applicant: Tokyo Electron Limited, Minato-ku, Tokyo (JP)

(72) Inventors: Kandabara N. Tapily, Mechanicville, NY (US); Satoru Nakamura, Albany, NY (US); Soo Doo Chae, Guilderland, NY (US); Akiteru Ko, Schenectady, NY (US); Kaoru Maekawa, Albany, NY (US); Gerrit J. Leusink, Rexford, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/697,249

(22) Filed: Sep. 6, 2017

(65) Prior Publication Data

US 2018/0068899 A1  Mar. 8, 2018

Related U.S. Application Data

(60) Provisional application No. 62/384,494, filed on Sep. 7, 2016.

(51) Int. Cl.
*H01L 21/8234* (2006.01)
*H01L 21/768* (2006.01)
(Continued)

(52) U.S. Cl.
CPC ............ *H01L 21/823475* (2013.01); *H01L 21/31144* (2013.01); *H01L 21/32139* (2013.01); *H01L 21/76892* (2013.01); *H01L 29/41791* (2013.01); *H01L 29/66795* (2013.01); *H01L 27/1211* (2013.01)

(58) Field of Classification Search
None
See application file for complete search history.

(56) References Cited

U.S. PATENT DOCUMENTS

| 4,707,218 A | 11/1987 | Giammarco et al. |
| 7,671,394 B2 | 3/2010 | Booth et al. |
| (Continued) | | |

OTHER PUBLICATIONS

United States Patent and Trademark Office, Non-final Office Action for U.S. Appl. No. 15/191,912, dated Jan. 30, 2017, 12 pages.

*Primary Examiner* — Asok K Sarkar (57) ABSTRACT

Embodiments of the invention provide a wrap-around contact integration scheme that includes sidewall protection during contact formation. According to one embodiment, a substrate processing method includes providing a substrate containing raised contacts in a first dielectric film and a second dielectric film above the first dielectric film, depositing a metal-containing film on the second dielectric film, and forming a patterned metal-containing film by etching mask openings in the metal-containing film. The method further includes anisotropically etching recessed features in the second dielectric film above the raised contacts using the patterned metal-containing film as a mask, where the anisotropically etching forms a metal-containing sidewall protection film by redeposition of a portion of the patterned metal-containing film on sidewalls of the recessed features.

20 Claims, 8 Drawing Sheets

(51) Int. Cl.
  *H01L 21/311* (2006.01)
  *H01L 21/3213* (2006.01)
  *H01L 29/417* (2006.01)
  *H01L 29/66* (2006.01)
  *H01L 27/12* (2006.01)

(56) References Cited

U.S. PATENT DOCUMENTS

| | | |
|---|---|---|
| 9,837,304 B2 | 12/2017 | Clark et al. |
| 2001/0002331 A1 | 5/2001 | Miyata |
| 2003/0064585 A1 | 4/2003 | Wu et al. |
| 2006/0049132 A1 | 3/2006 | Wu et al. |
| 2007/0202700 A1* | 8/2007 | Leucke ............... C23F 4/00 438/689 |
| 2008/0258237 A1 | 10/2008 | Kim |
| 2009/0091037 A1* | 4/2009 | Assefa ............... H01L 43/12 257/773 |
| 2009/0286402 A1 | 11/2009 | Xia et al. |
| 2011/0248326 A1 | 10/2011 | Kanakasabapathy et al. |
| 2013/0115778 A1 | 5/2013 | Xue et al. |
| 2015/0235859 A1 | 8/2015 | Armbruster et al. |

\* cited by examiner

WRAP-AROUND CONTACT INTEGRATION SCHEME

CROSS-REFERENCE TO RELATED APPLICATIONS

This application is related to and claims priority to U.S. Provisional Patent Application Ser. No. 62/384,494 filed on Sep. 7, 2016, the entire contents of which are herein incorporated by reference.

FIELD OF INVENTION

The present invention relates to the field of semiconductor manufacturing and semiconductor devices, and more particularly, to a wrap-around contact (WAC) integration scheme that includes sidewall protection during contact formation.

BACKGROUND OF THE INVENTION

Current and future generations of metal-oxide-semiconductor field-effect transistors (MOSFETs) require tight control of parasitic capacitance while simultaneously optimizing metal-semiconductor contact resistance. In FinFET structures, maximizing the contact area can be achieved by creating a contact that wraps around the fin or by growing faceted epitaxial contacts, and then wrapping metal around the faceted epitaxial contact. The adoption of ultra-thin transistor body structures such as FinFET and fully depleted silicon-on-insulator (FDSOI) has exacerbated the problem for logic manufacturing. In order to reduce contact resistance in FinFET structures, device makers are contemplating WAC structures that allow metal-semiconductor contacts with increased area.

SUMMARY OF THE INVENTION

Embodiments of the invention provide a wrap-around contact integration scheme that includes sidewall protection during contact formation. According to one embodiment, a substrate processing method includes providing a substrate containing raised contacts in a first dielectric film and a second dielectric film above the first dielectric film, depositing a metal-containing film on the second dielectric film, and forming a patterned metal-containing film by etching mask openings in the metal-containing film. The method further includes anisotropically etching recessed features in the second dielectric film above the raised contacts using the patterned metal-containing film as a mask, where the anisotropically etching forms a metal-containing sidewall protection film by redeposition of a portion of the patterned metal-containing film on sidewalls of the recessed features.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF SEVERAL EMBODIMENTS

Figure 1:
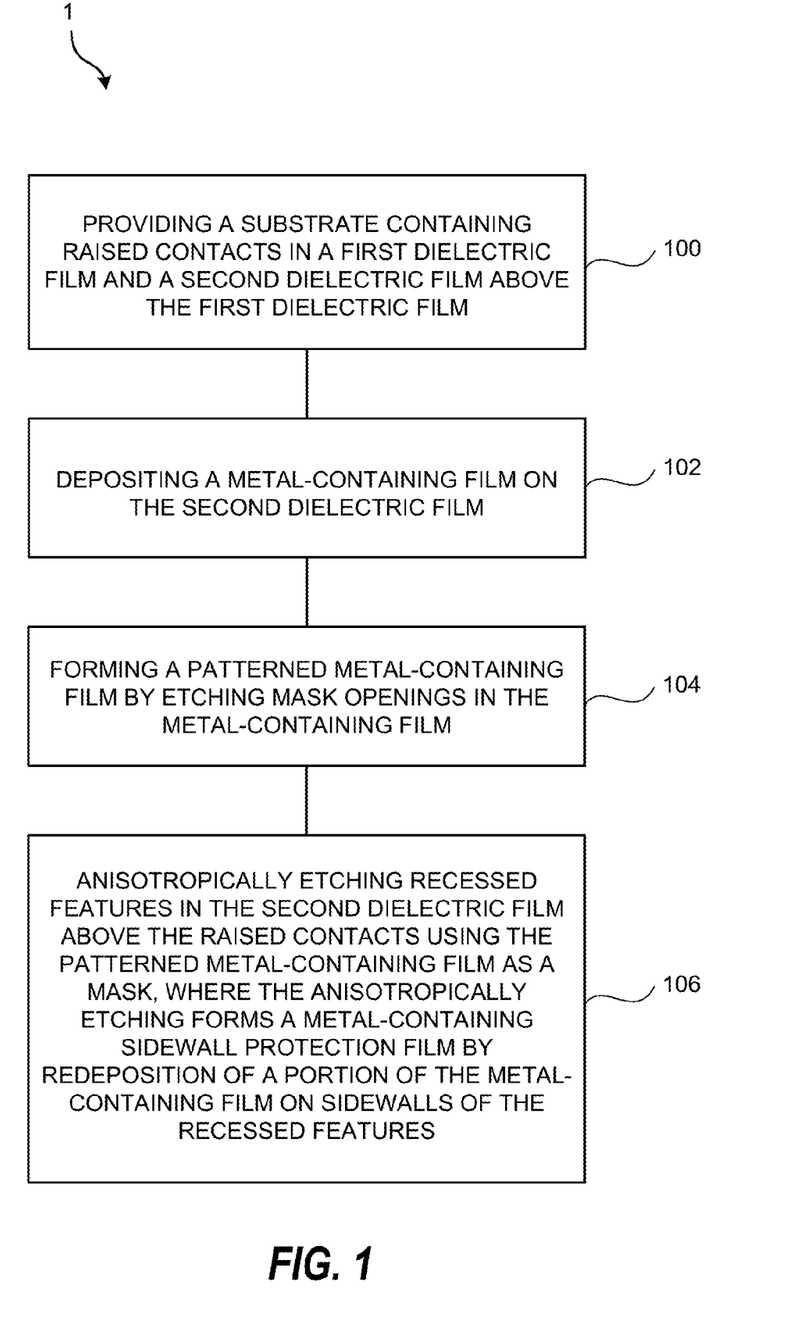
FIG. 1 is a process flow diagram for a method of processing a substrate according to an embodiment of the invention.

FIG. 1 is a process flow diagram 1 for a method of processing a substrate according to an embodiment of the invention, and FIGS. 2A-2I schematically show through cross-sectional views a method of processing a substrate according to an embodiment of the invention.

Figure 2A:
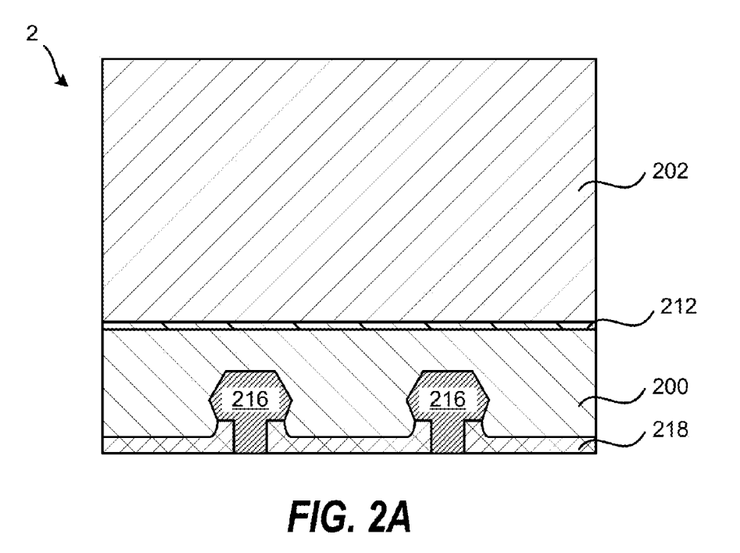
FIGS. 2A-2J schematically show through cross-sectional views a method of processing a substrate according to an embodiment of the invention.

The method includes, in 100, providing a substrate 2 containing raised contacts 216 in a first dielectric film 200 and a second dielectric film 202 above the first dielectric film 200. The substrate 2 further includes an etch stop layer 212 on the first dielectric film 200, and a dielectric film 218 underneath the first dielectric film 200. The etch stop layer 212 may be used to terminate etching during the formation of recessed features in the second dielectric film 202. In some examples, the first dielectric film 200 may contain $SiO_2$, SiON, SiN, a high-k material, a low-k material, or an ultra-low-k material. In some examples, the second dielectric film 202 may contain $SiO_2$, SiON, SiN, a high-k material, a low-k material, or an ultra-low-k material. The raised contact can include SiGe or SiC. The etch stop layer 212 may, for example, include a high-k material, SiN, $SiO_2$, carbon (C), or Si.

Figure 2B:
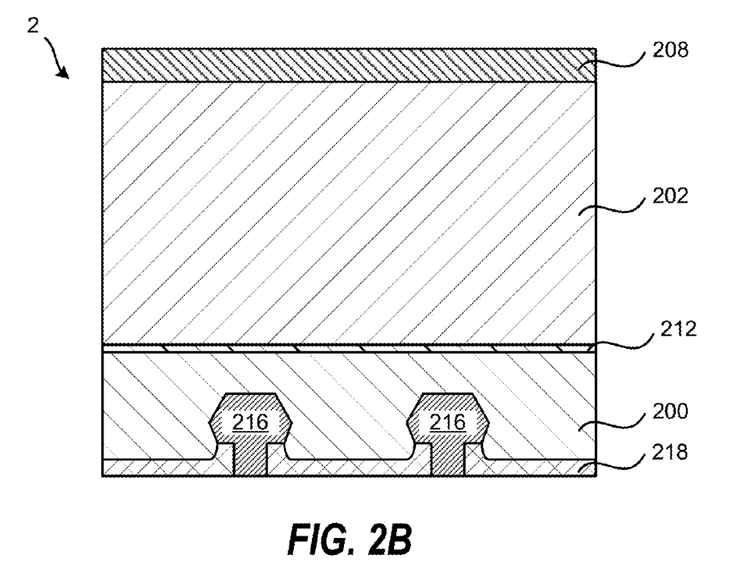

The process flow diagram 1 further includes, in 102, depositing a metal-containing film 208 on the second dielectric film 202. This is schematically shown in FIG. 2B. According to one embodiment, the metal-containing film 208 may be conformally deposited by atomic layer deposition (ALD). ALD can deposit very thin films with atomic level thickness control and excellent conformality over advanced raised and recessed features. The metal-containing film 208 may be selected from the group consisting of a metal oxide film, a metal nitride film, a metal oxynitride film, a metal silicate film, and a combination thereof. In one example, the metal oxide film may be selected from the group consisting of $Al_2O_3$, $HfO_2$, $TiO_2$, $ZrO_2$, $Y_2O_3$, $La_2O_3$, $UO_2$, $Lu_2O_3$, $Ta_2O_5$, $Nb_2O_5$, ZnO, MgO, CaO, BeO, $V_2O_5$, FeO, $FeO_2$, CrO, $Cr_2O_3$, $CrO_2$, MnO, $Mn_2O_3$, $RuO$, and a combination thereof. In some examples, a thickness of the metal-containing film 208 can be between about 10 nm and about 100 nm, between about 10 nm and about 50 nm, between about 5 nm and about 10 nm, between about 10 nm and about 30 nm, between about 30 nm and about 100 nm, between about 50 nm and about 100 nm, less than about 50 nm, or less than about 30 nm.

In one example, the metal-containing film 208 can include a metal oxide film that is deposited using ALD by a) pulsing a metal-containing precursor into a process chamber containing the substrate, b) purging the process chamber with an inert gas, c) pulsing an oxygen-containing precursor into the process chamber, d) purging the process chamber with an inert gas, and e) repeating a)-d) at least once.

Figure 2C:
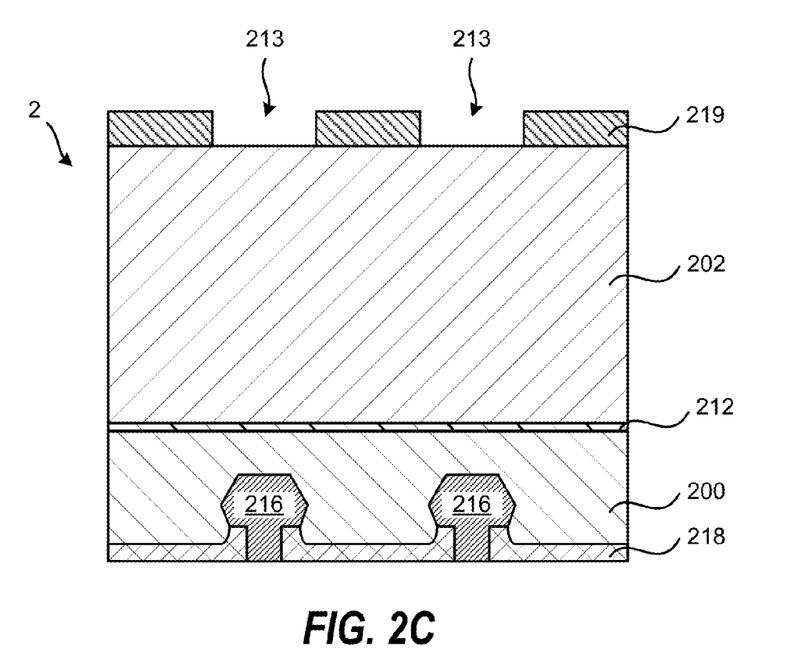

The process flow diagram 1 further includes, in 104, forming a patterned metal-containing film 219 by etching mask openings 213 in the metal-containing film 208. This is schematically shown in FIG. 2C. The patterning of the metal-containing film 208 may be performed using well-known lithography and etching processes. In one example, the metal-containing film 208 can contain an $Al_2O_3$ film that may be patterned using a plasma-excited process gas containing $BCl_3$ gas and He gas.

Figure 2D:
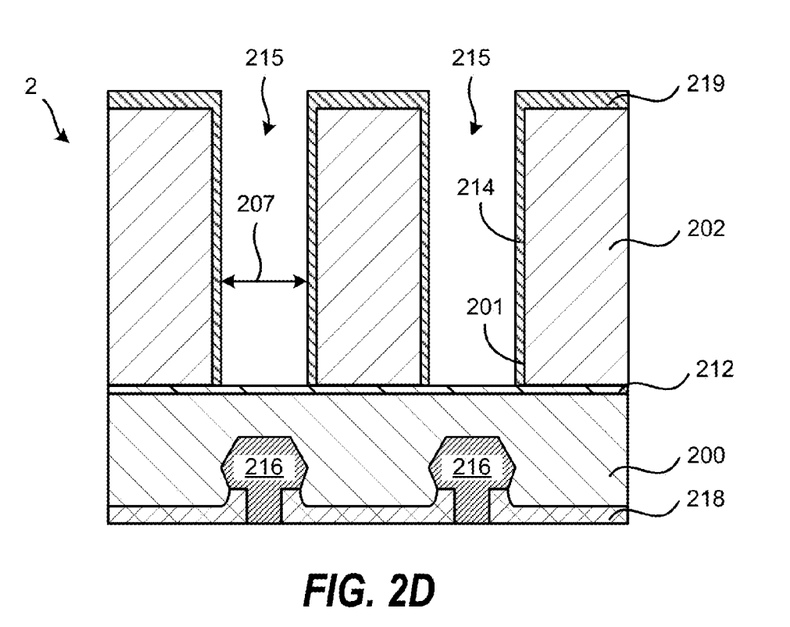

The process flow diagram 1 further includes, in 106, anisotropically etching recessed features 215 in the second dielectric film 202 above the raised contacts 216 using the patterned metal-containing film 219 as a mask, where the anisotropically etching forms a metal-containing sidewall protection film 214 by redeposition of a portion of the patterned metal-containing film 219 on sidewalls 201 of the recessed features 215. This is schematically shown in FIG. 2D.

The recessed features 215 can, for example, have a width 207 that is less than 200 nm, less than 100 nm, less than 50 nm, less than 25 nm, less than 20 nm, or less than 10 nm. In other examples, the recessed features 215 can have a width 207 that is between 5 nm and 10 nm, between 10 nm and 20 nm, between 20 nm and 50 nm, between 50 nm and 100 nm, between 100 nm and 200 nm, between 10 nm and 50 nm, or between 10 nm and 100 nm. The width 207 can also be referred to as a critical dimension (CD). The recessed features 215 can, for example, have a depth of 25 nm, 50 nm, 100 nm, 200 nm, or greater.

According to some embodiments of the inventions, the metal-containing sidewall protection film 214, which is formed during the etching of the recessed features 215, may be utilized to protect the sidewalls 201 of the second dielectric film 202 from erosion or damage during further processing of the substrate 2. The further processing can include one or more cleaning processes to remove etch residue from the recessed features 215 and/or one or more anisotropic or isotropic etching processes that may be performed to etch contact openings in the first dielectric film 200 without significantly increasing the width 207 of the recessed features 215. According to one embodiment, the metal-containing sidewall protection film 214 may have a varying thickness in the recessed features 215 or may not cover the entire sidewalls 201. For example, the metal-containing sidewall protection film 214 may be thinner near the bottom of the recessed features 215 than near the top of the recessed features 215. In one example, the metal-containing sidewall protection film 214 may be missing or very thin from the sidewalls 201 near the bottom of the recessed features 215.

Figure 2E:
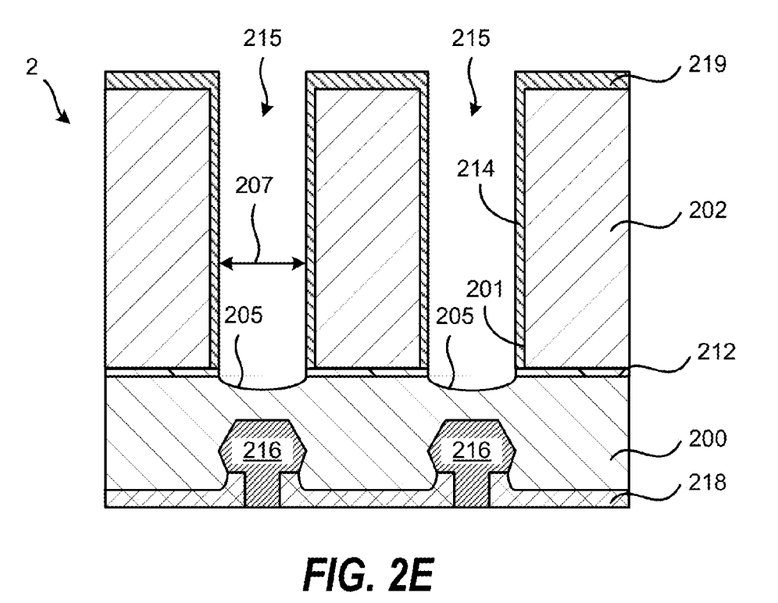
Figure 2F:
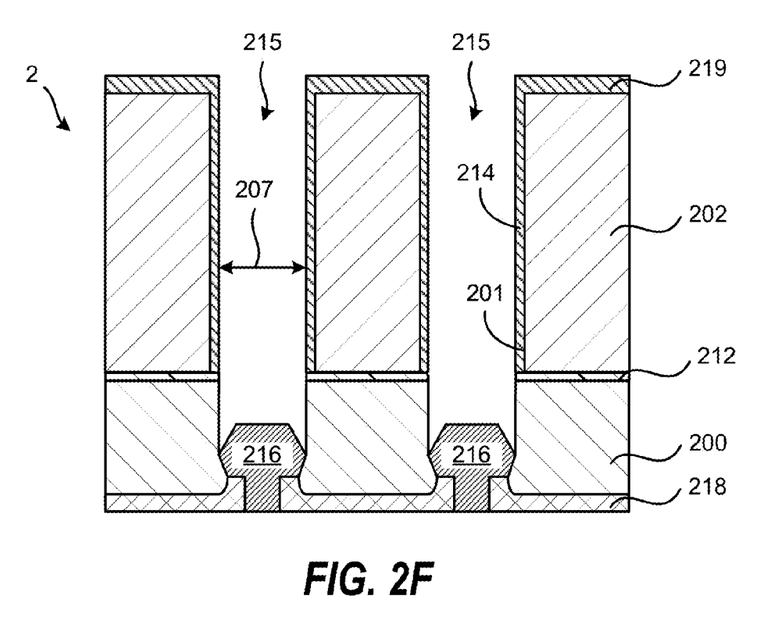

Further processing of the substrate 2 can include using an anisotropic etching process to etch through the etch stop layer 212 and form a recess 205 in the first dielectric film 200. This is schematically shown in FIG. 2E. In one example, the anisotropic etching process can include a digital etching process or an atomic layer etching (ALE) process. Thereafter, the recessed features 215 may be extended to the raised contact 216 in the first dielectric film 200 using an anisotropic etching process. This is schematically shown in FIG. 2F. The metal-containing sidewall protection film 214 can have an adequate thickness and etch resistance to prevent or reduce etching of the sidewall 201 during the anisotropic etching processes, thus preventing loss of CD in the recessed features 215.

Figure 2G:
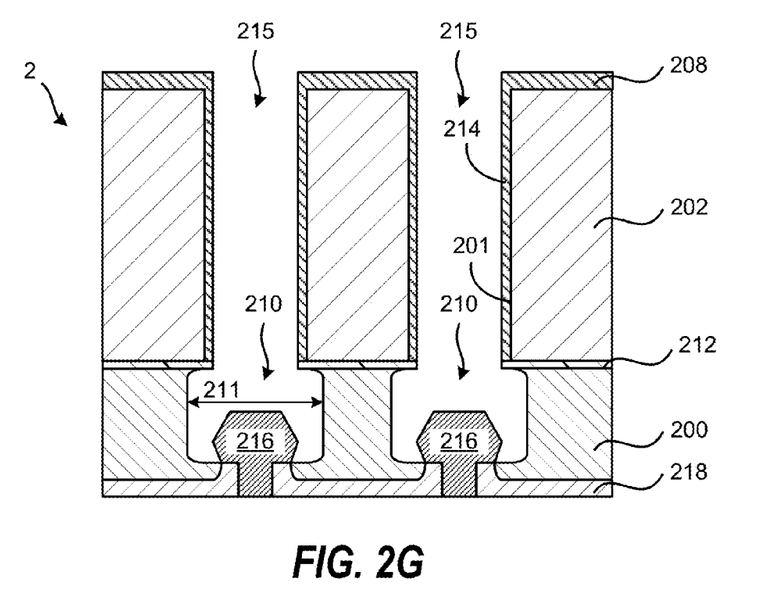

Following the anisotropic etching process, contact openings 210 containing the raised contacts 216 may be formed in the first dielectric film 200 below the recessed features 215 using an isotropic etching process. This is schematically shown in FIG. 2G. The contact openings 210 have a width 211 that is greater than the width 207 of the recessed features 215. During the isotropic etching process, the metal-containing sidewall protection film 214 prevents or reduces etching of the sidewall 201. In some examples, the isotropic etching process can utilize a COR process or the use of dilute HF solution (DHF). The COR process can utilize simultaneous of alternating gaseous exposures of HF and $NH_3$, followed by heat-treating to remove etch byproducts from the substrate 2.

Figure 2H:
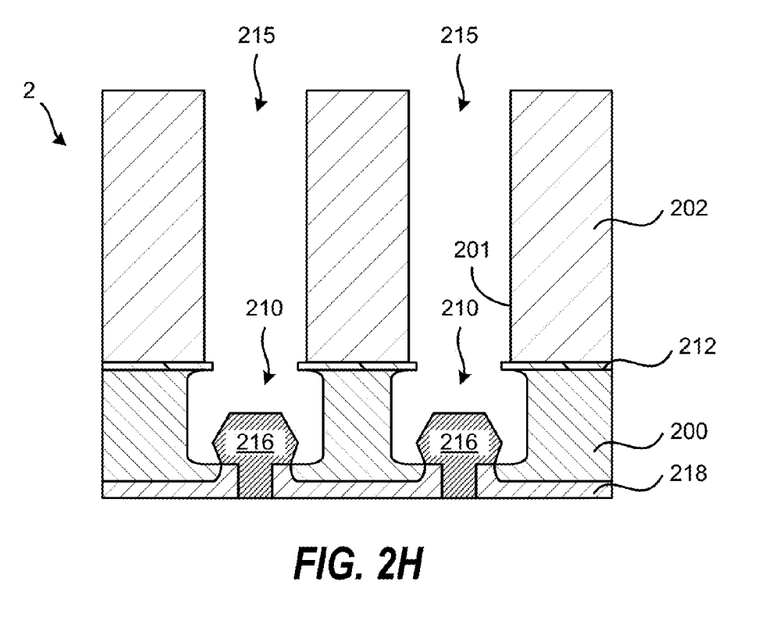
Figure 2I:
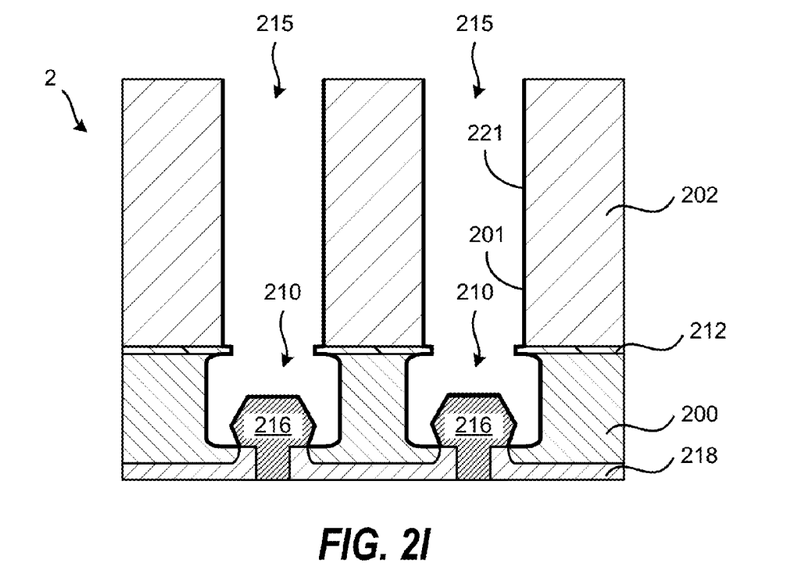
Figure 2J:
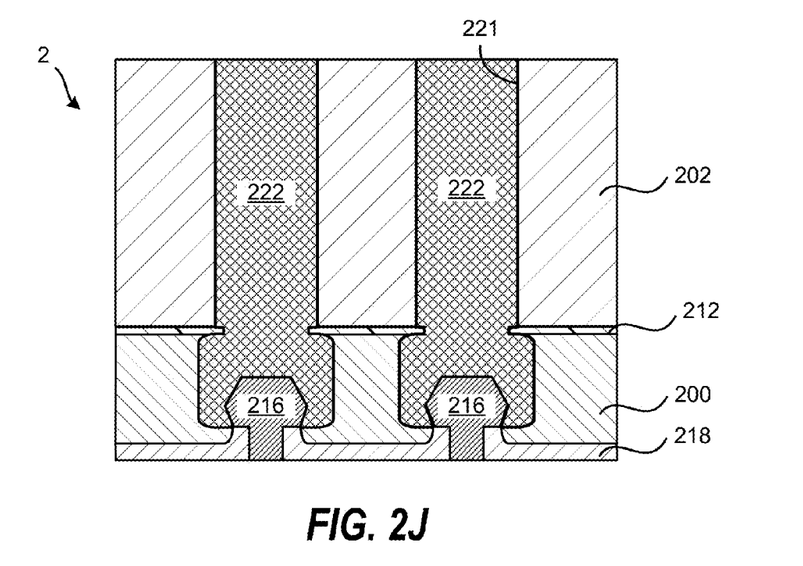

Following the isotropic etching process, the metal-containing sidewall protection film 214 may be removed from the substrate 2. This is schematically shown in FIG. 2H. According to one embodiment, the patterned metal-containing film 219 and metal-containing sidewall protection film 214 may be removed using ALE. In one example, an $Al_2O_3$ film may be removed by trimethyl amine (TMA) and HF using ALE. In another example, the $Al_2O_3$ film may be removed using plasma-excited $BCl_3$ and Ar. Thereafter, a contact metal layer and a barrier layer may be sequentially deposited on the sidewalls 201 in the recessed features 215 and on surfaces in the contact openings 210, including on the raised contacts 216. The contact metal layer/barrier layer are schematically shown as layer 221 in FIG. 2I. In one example, the contact metal layer can include a Ti metal layer, a Co metal layer, or a Ni metal layer. In one example, the contact metal layer can include a Ti metal layer and the barrier layer can include a TiN layer. Thereafter, the recessed features 215 and the contact openings 210 may be filled with a metal 222. This is schematically shown in FIG. 2J. In one example, the metal may be selected from the group consisting of Ru, Rh, Os, Pd, Ir, Pt, Ni, Co, W, and a combination thereof.

Figure 3A:
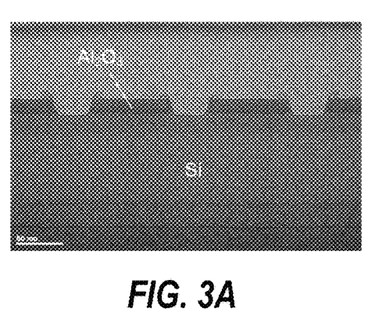
FIG. 3A shows a cross-sectional scanning electron microscopy (SEM) image of a patterned $Al_2O_3$ film according to an embodiment of the invention.
Figure 3B:
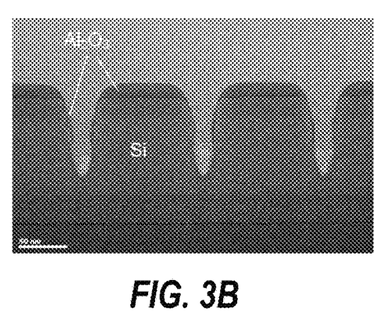
FIG. 3B shows a cross-sectional SEM image of an $Al_2O_3$ sidewall protection film formed on sidewalls of recessed features according to an embodiment of the invention.

FIG. 3A shows a cross-sectional SEM image of a patterned $Al_2O_3$ film according to an embodiment of the invention. The $Al_2O_3$ film was formed by depositing an $Al_2O_3$ film by ALD on a Si substrate, and thereafter etching mask openings in the $Al_2O_3$ film using a patterned photoresist layer and plasma-excited process gas containing $BCl_3$ gas and He gas. FIG. 3B shows a cross-sectional SEM image of an $Al_2O_3$ sidewall protection film formed on sidewalls of recessed features according to an embodiment of the invention. According to one embodiment, the recessed features and the $Al_2O_3$ sidewall protection film may be formed by alternately exposing the structure in FIG. 3A to $BCl_3$ gas and plasma-excited Ar gas or He gas.

Figure 4A:
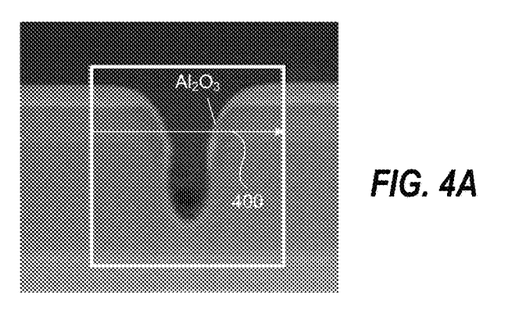
FIG. 4A shows a cross-sectional SEM image of an $Al_2O_3$ sidewall protection film formed on a sidewall of a recessed feature according to an embodiment of the invention.
Figure 4B:
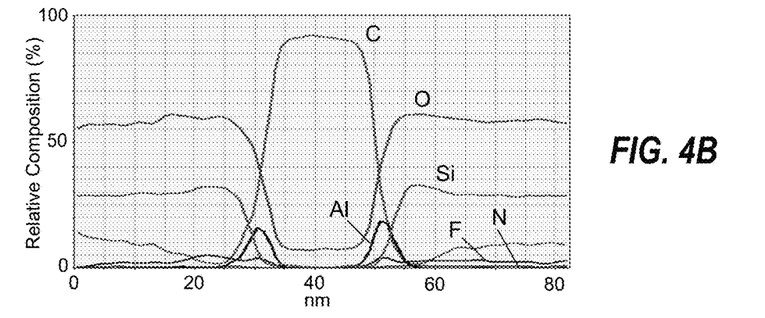
FIG. 4B shows elemental scans for C, N, O, F, Al and Si for the substrate in FIG. 4A.

FIG. 4A shows a cross-sectional SEM image of an $Al_2O_3$ sidewall protection film formed on a sidewall of a recessed feature according to an embodiment of the invention. The film structure in FIG. 4A included, from top to bottom, $Al_2O_3$/$SiO_2$/SiN/Si. An elemental scan for determining the chemical composition of the cross-sectional SEM image was performed from left to right along the horizontal line 400 in order to create elemental maps for C, N, O, F, Al and Si. The results are shown in FIG. 4B where an $Al_2O_3$ sidewall protection film is present on the sidewalls of the recessed feature.

Figure 5A:
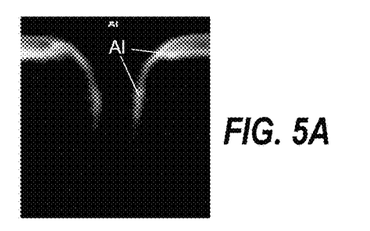
FIGS. 5A-5D shows elemental maps for Al, O, Si, and C for the substrate in FIG. 4A.
Figure 5B:
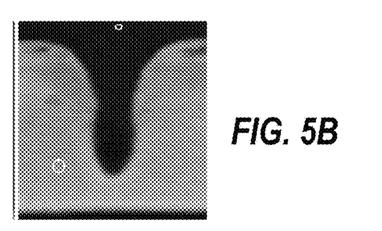
Figure 5C:
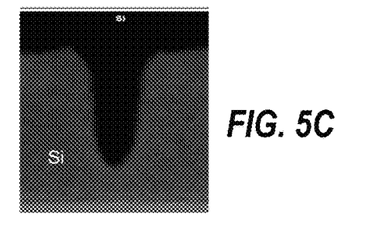
Figure 5D:
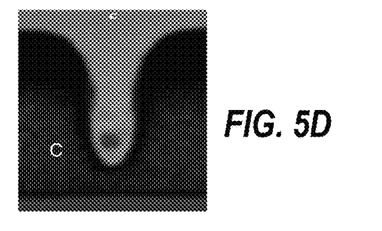

FIGS. 5A-5D shows elemental maps for Al, O, Si, and C for the substrate in FIG. 4A. In FIG. 5A, the $Al_2O_3$ sidewall protection film is clearly visible in the elemental map.

Figure 6:
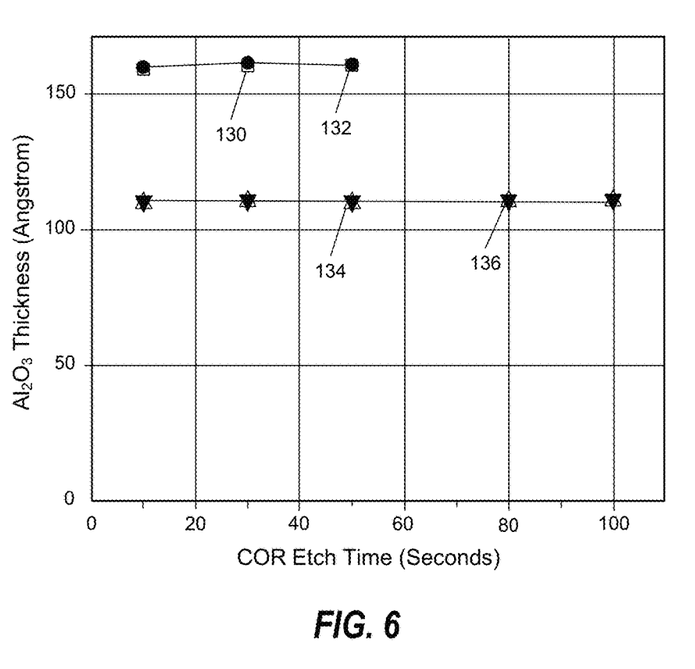
FIG. 6 shows experimental results for a chemical oxide removal (COR) process for etching an $Al_2O_3$ film according to an embodiment of the invention.

FIG. 6 shows experimental results for a COR process for etching an $Al_2O_3$ film according to an embodiment of the invention. Traces 130 and 134 show an $Al_2O_3$ film thickness before the COR process, and traces 132 and 134 show the Al$_2$O$_3$ film thickness after the COR process. The results show that Al$_2$O$_3$ films were not etched during the COR process, and therefore, Al$_2$O$_3$ may be used as a protection film on sidewalls of recessed features, for example during the isotropic COR etching process used to form the contact openings 210 in FIG. 2G.

Methods for performing a wrap-around contact integration scheme that includes sidewall protection during contact formation have been disclosed in various embodiments. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A substrate processing method, comprising:
    providing a substrate containing raised contacts in a first dielectric film and a second dielectric film above the first dielectric film;
    depositing a metal-containing film on the second dielectric film;
    forming a patterned metal-containing film by etching mask openings in the metal-containing film; and
    anisotropically etching recessed features in the second dielectric film above the raised contacts using the patterned metal-containing film as a mask, wherein the anisotropically etching forms a metal-containing sidewall protection film by redeposition of a portion of the patterned metal-containing film on sidewalls of the recessed features.

2. The method of claim 1, further comprising
    isotropically etching contact openings in the first dielectric film that expose the raised contacts below the recessed features in the second dielectric film, wherein a width of the contact openings is greater than a width of the recessed features defined by the metal-containing sidewall protection film.

3. The method of claim 2, further comprising
    following the isotropically etching, removing the patterned metal-containing film and the metal-containing sidewall protection film from the substrate.

4. The method of claim 2, further comprising:
    prior to isotropically etching the contact openings, extending the recessed features to the raised contacts in the first dielectric film.

5. The method of claim 2, further comprising:
    depositing a contact metal layer in the recessed features and on the raised contacts in the contact openings.

6. The method of claim 5, wherein the contact metal layer includes a Ti metal layer, a Co metal layer, or a Ni metal layer.

7. The method of claim 5, further comprising:
    depositing barrier layer on the contact metal layer.

8. The method of claim 7, wherein the barrier layer includes a TiN layer.

9. The method of claim 2, further comprising:
    filling the recessed features and the contact openings with a metal.

10. The method of claim 9, wherein the metal is selected from the group consisting of Ru, Rh, Os, Pd, Ir, Pt, Ni, Co, W, and a combination thereof.

11. The method of claim 9, further comprising:
    prior to the filling, removing the metal-containing sidewall protection film from the recessed features.

12. The method of claim 1, wherein the first dielectric film, the second dielectric film, or both the first and second dielectric films, include SiO$_2$.

13. The method of claim 1, wherein the metal-containing film is selected from the group consisting of a metal oxide film, a metal nitride film, a metal oxynitride film, a metal silicate film, and a combination thereof.

14. The method of claim 13, wherein the metal oxide film is selected from the group consisting of Al$_2$O$_3$, HfO$_2$, TiO$_2$, ZrO$_2$, Y$_2$O$_3$, La$_2$O$_3$, UO$_2$, Lu$_2$O$_3$, Ta$_2$O$_5$, Nb$_2$O$_5$, ZnO, MgO, CaO, BeO, V$_2$O$_5$, FeO, FeO$_2$, CrO, Cr$_2$O$_3$, CrO$_2$, MnO, Mn$_2$O$_3$, RuO, and a combination thereof.

15. The method of claim 1, wherein the raised contacts include SiGe or SiC.

16. A substrate processing method, comprising:
    providing a substrate containing raised contacts in a first dielectric film and a second dielectric film above the first dielectric film;
    depositing an Al$_2$O$_3$ film on the second dielectric film;
    forming a patterned Al$_2$O$_3$ film by etching mask openings in the Al$_2$O$_3$ film;
    anisotropically etching recessed features in the second dielectric film above the raised contacts using the patterned Al$_2$O$_3$ film as a mask, wherein the anisotropically etching forms an Al$_2$O$_3$ sidewall protection film by redeposition of a portion of the patterned Al$_2$O$_3$ film on sidewalls of the recessed features; and
    isotropically etching contact openings in the first dielectric film that expose the raised contacts below the recessed features in the second dielectric film, wherein a width of the contact openings is greater than a width of the recessed features defined by the Al$_2$O$_3$ sidewall protection film.

17. The method of claim 16, further comprising
    following the isotropically etching, removing the patterned Al$_2$O$_3$ film and the Al$_2$O$_3$ sidewall protection film from the substrate.

18. The method of claim 16, further comprising:
    prior to isotropically etching the contact openings, extending the recessed features to the raised contacts in the first dielectric film.

19. The method of claim 16, further comprising:
    depositing a contact metal layer in the recessed features and on the raised contacts in the contact openings; and
    depositing barrier layer on the contact metal layer.

20. The method of claim 16, further comprising, filling the recessed features and the contact openings with a metal that is selected from the group consisting of Ru, Rh, Os, Pd, Ir, Pt, Ni, Co, W, and a combination thereof.

* * * * *